(12) United States Patent
Han et al.

(10) Patent No.: US 12,232,305 B2
(45) Date of Patent: Feb. 18, 2025

(54) REDUCING ELECTROMAGNETIC WAVES USING LIGHTWEIGHT METAL FOAM

(71) Applicant: CellMo Materials Innovation, Inc., Berkeley, CA (US)

(72) Inventors: Gigap Han, Chungcheongnam-do (KR); Kaiwen Tseng, Los Altos, CA (US); Heeman Choe, Conroe, TX (US)

(73) Assignee: CellMo Materials Innovation, Inc., Conroe, TX (US)

( * ) Notice: Subject to any disclaimer, the term of this patent is extended or adjusted under 35 U.S.C. 154(b) by 0 days.

(21) Appl. No.: 17/907,661

(22) PCT Filed: Mar. 30, 2021

(86) PCT No.: PCT/US2021/024965
§ 371 (c)(1),
(2) Date: Sep. 28, 2022

(87) PCT Pub. No.: WO2021/202586
PCT Pub. Date: Oct. 7, 2021

(65) Prior Publication Data
US 2023/0156986 A1 May 18, 2023

Related U.S. Application Data

(60) Provisional application No. 63/003,167, filed on Mar. 31, 2020.

(51) Int. Cl.
*H05K 9/00* (2006.01)
(52) U.S. Cl.
CPC ......... *H05K 9/0081* (2013.01); *H05K 9/0049* (2013.01)
(58) Field of Classification Search
CPC .................................................. H05K 9/0086
See application file for complete search history.

(56) References Cited

U.S. PATENT DOCUMENTS 6,309,742 B1 * 10/2001 Clupper ............... H05K 9/0015
428/317.1
2007/0147008 A1 * 6/2007 Mongia ..................... G06F 1/20
361/719
(Continued)

FOREIGN PATENT DOCUMENTS

WO 2014080429 A1 5/2014
WO 2020005013 A1 1/2020

OTHER PUBLICATIONS

Kumar, R., et al., "Lightweight open cell aluminum foam for superior mechanical and electromagnetic interference shielding properties," Materials Chemistry and Physics, 240, Sep. 9, 2019 (Sep. 9, 2019), 8 pages.
(Continued)

*Primary Examiner* — Hung V Ngo
(74) *Attorney, Agent, or Firm* — Aka Chan LLP

(57) ABSTRACT

A metal-foam structure is used to shield or reduce harmful electromagnetic waves that are generated by electronic devices. A metal-foam material has regulated pores and is incorporated in an electronic device. The metal foam structure shields, prevents, or reduces harmful electromagnetic waves generated by the electronic device from reaching the human body or interfering with a sensitive electronic component. This metal foam is a relatively lightweight material having regulated microscale pore structure. The pores in the metal foam can also form directionality relative to the direction of incoming electromagnetic waves for more effective reflection or absorption of electromagnetic waves. The metal foam can also be used as both an electromagnetic-shielding and a heat-dissipating component for electronics including popular consumer electronics such as mobile phones, notebooks, and high-power desktop computers.

20 Claims, 4 Drawing Sheets

(56) References Cited

U.S. PATENT DOCUMENTS

| | | |
|---|---|---|
| 2014/0004441 A1 | 1/2014 | Cho et al. |
| 2015/0072236 A1 | 3/2015 | Um et al. |
| 2017/0021416 A1 | 1/2017 | Park et al. |
| 2017/0025683 A1 | 1/2017 | Park et al. |
| 2019/0247925 A1 | 8/2019 | Um et al. |

OTHER PUBLICATIONS

Han, X., et al., "A review of metal foam and metal matrix composites for heat exchangers and heat sinks," Heat Transfer Engineering, 33(12): 991-1009, Sep. 2012, [online] [retrieved on Aug. 29, 2022]. Retrieved from the Internet: <URL: https://biblio.ugent.be/publication/4093024/file/4093033>, 75 pages.
International Search Report, PCT Application PCT/US2021/024965, Jul. 22, 2021, 5 pages.
Chino, Y., et al., (2008), Directionally freeze-cast titanium foam with aligned, elongated pores. Acta Materialia, 56: 105-113.
Extended European Search Report for European Patent Application No. 21780073.9 dated Mar. 27, 2024, 11 pages.

\* cited by examiner

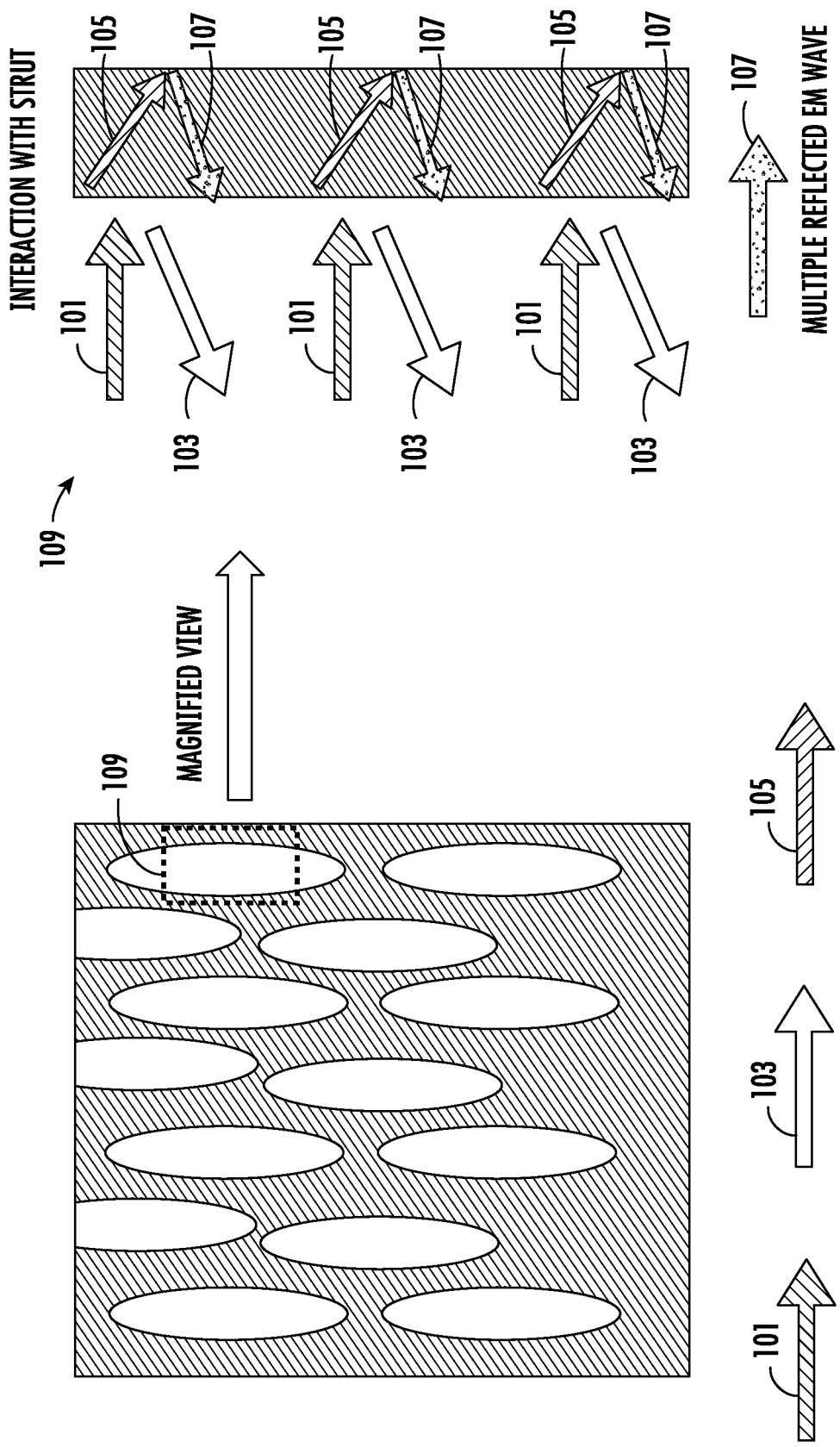

REDUCING ELECTROMAGNETIC WAVES USING LIGHTWEIGHT METAL FOAM

CROSS-REFERENCE TO RELATED APPLICATIONS

This patent application is a section 371 national phase filing of PCT application PCT/US2021/024965, filed Mar. 30, 2021, which claims the benefit of U.S. patent application 63/003,167, filed Mar. 31, 2020.

BACKGROUND OF THE INVENTION

This invention relates to the metal foams, and more specifically to a method or device using metal foams for shielding or reducing harmful electromagnetic (EM) waves generated by an electronic device.

With the dramatically increasing development of electronic consumer display, medical equipment, and portable devices such high-power cellular phones, smartphones, tablet computers, and notebooks and laptops, it is becoming more and more important to shield or diminish as much harmful electromagnetic waves as possible that are generated from those power devices. Furthermore, the magnetic waves should be prevented as they can also provide causes of failures or malfunctions in electronic components.

Most common materials used for shielding or diminishing electromagnetic waves are heavy bulk metals based on copper, iron, nickel, aluminum, and other. Carbon nanotube or metal-coated plastic materials are also used for this purpose but they are relatively expensive or less effective.

Therefore, there is an urgent need for a new material or device that can effectively shield electromagnetic waves, and is lightweight and affordable. Three-dimensional-structured metal foam material having uniform pores is a perfect candidate, where this material is lightweight due to its pore structure and can prevents or reduces harmful electromagnetic waves from reaching human body to eliminate or reduce brain damage, abnormal body temperature, and hazard to an embryo caused by such electromagnetic waves.

BRIEF SUMMARY OF THE INVENTION

A lightweight metal foam material has regulated pores and is incorporated in an electronic device. The metal foam structure shields, prevents, or reduces harmful electromagnetic waves generated by the electronic device from reaching the human body or sensitive electronic components. The metal foam is a relatively lightweight material having regulated pore structure, with specifically intended porosity and pore size. For example, the weight of copper foam with about 67 percent porosity is only one third of its bulk counterpart. The metal foam can be used as an electromagnetic-shielding component device for electronics including popular consumer electronics such as 5G cellular phones, notebooks, light emitting diodes, and high-power desktop computers.

With the dramatically increasing development of advanced electronic products, electromagnetic-wave materials technology, which can shield or diminish as much harmful electromagnetic waves as possible that are generated from those power devices, is attracting considerable attention from the information technology industry. Here, this invention relates to the metal foams, and more specifically to a device or component using metal foams for shielding or reducing harmful electromagnetic waves generated from the electronic device. A metal-foam material has regulated pores and is incorporated in an electronic device. The metal foam structure shields, prevents, or reduces harmful electromagnetic waves generated by the electronic device from reaching the human body or sensitive electronic component. This metal foam is a relatively lightweight material having regulated microscale pore structure. The pores in the metal foam can also form directionality relative to the direction of incoming electromagnetic waves for more effective reflection of electromagnetic waves. The metal foam can also be used as both an electromagnetic-shielding component and a heat-dissipating device for electronics including popular consumer electronics such as 5G cellular phones, notebooks, and high-power desktop computers.

In an implementation, a structure includes a metal-foam material containing a uniform microscale pore structure that effectively shields or reduces electromagnetic waves generated by electronic device due to its enhanced surface area. The structure can be a sheet. A metal-foam container can include the structure. A device, such as a smartphone, computer, television, radio, or other electronics, can include the structure.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 1A-1B show schematic diagrams of metal foam that is capable of both reflecting and absorbing electromagnetic waves generated from an electronic device.

DETAILED DESCRIPTION OF THE INVENTION

Figure 2A:
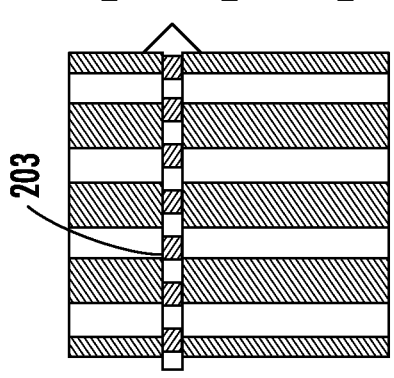
FIGS. 2A-2C show schematic diagrams showing metal foams with different pore directions in relation to the direction of incoming electromagnetic waves.

Some materials are known to be capable of reflecting and absorbing, and thus reducing electromagnetic waves generated from consumer electronics and the components contained within them. Those materials are generally selected from the elements or combinations of those with good electrical conductivity and magnetic permeability such as iron, copper, nickel, aluminum, carbon and so on, which can thus lead to the reflection and absorption of electromagnetic waves on their surface. Alternatively, it is possible to create composite materials with two or three elements to form unique structure such as a carbon-coated material and core-shell structure. These materials are disadvantageous due to their high cost, heavy weight, and complicated process with uncontrolled microstructure.

Metal foams can be effective in shielding electromagnetic waves through both reflection and absorption. In particular, metal foams with relatively high porosity and small pore size (e.g., enhanced surface area) can reflect them more effectively than their bulk counterparts. On the other hand, metal foams with relatively thick strut or wall dimensions can absorb them efficiently.

A metal foam material is used as a form of component (e.g., shield, case, enclosure, or structure) of an electronic device which can generate harmful electromagnetic waves. The metal foam reflects or absorbs, or both, electromagnetic waves and thus reduces electromagnetic waves generated from consumer electronics and components contained within them.

Specifically, metal foams can be created via freeze casting and are advantageous for use in this application as the pore size, porosity, pore directionality (e.g., to enhance the reflection efficiency), and uniform pore distribution can be well controlled by manipulating basic processing parameters. Methods of manufacturing a metal foam are described in, for example, U.S. patent application Ser. No. 13/930,887, filed Jun. 28, 2013; Ser. No. 14/256,838, filed Apr. 18, 2014; Ser. No. 15/215,519, filed Jul. 20, 2016 (U.S. patent publication number 2017/0025683); Ser. No. 15/215,541, filed Jul. 20, 2016 (U.S. patent publication number 2017/0021416); and Ser. No. 16/392,526, filed Apr. 23, 2019 (U.S. patent publication number 2019/0247925).

Further, a metal-foam component attached via a common thermal interface material, brazing, welding or soldering to a device can act as both a heat sink and a shielding block for high-power semiconductor or any electronic device that generates strong electromagnetic waves.

This patent describes some examples of implementations with specific dimensions, measurements, temperatures, and values. These are not intended to be exhaustive or to limit the invention to the precise form described. The values, percentages, times, and temperatures are approximate values. These values can vary due to, for example, measurement or manufacturing variations or tolerances or other factors. For example, depending on the tightness of the manufacturing and measurement tolerances, the values can vary plus or minus 5 percent, plus or minus 7.5 percent, plus or minus 10 percent, plus or minus 12.5 percent, plus or minus 15 percent, plus or minus 17.5 percent, plus or minus 20 percent, or plus or minus 25 percent.

Further, the values are for a specific implementation, and other implementations can have different values, such as certain values made larger for a larger-scaled process or product, or smaller for a smaller-scaled product. A device, apparatus, or process may be made proportionally larger or smaller by adjusting relative measurements proportionally (e.g., maintaining the same or about the same ratio between different measurements). In various implementations, the values can be the same as the value given, about the same of the value given, at least or greater than the value given, can be at most or less than the value given, or between any of the values given (inclusive or exclusive), or any combination of these.

FIGS. 1A-1B show schematic diagrams of metal foam being capable of both reflecting and absorbing electromagnetic waves generated from an electronic device. There are arrows 101 representing an initial electromagnetic wave, arrows 103 representing an electromagnetic wave reflected, arrows 105 representing an electromagnetic wave absorbed, and arrows 107 representing multiple reflective electromagnetic waves. FIG. 1B shows a magnified view of a section 109 of FIG. 1A. Here, the large surface area of the "open-cell" meal-foam component is beneficial for providing more effective wave reflection than its bulk counterpart of the same dimension.

Figure 2B:
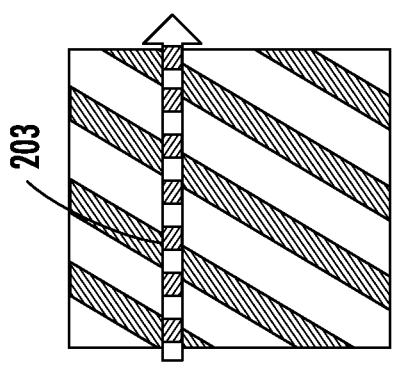
Figure 2C:
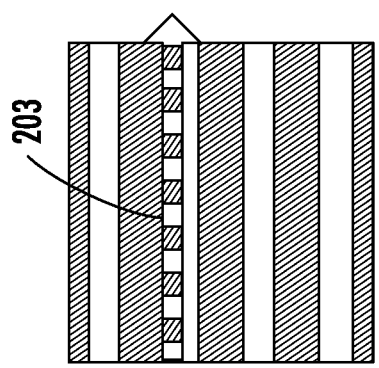

FIGS. 2A-2C show schematic diagrams showing metal foams with different pore directions. In FIGS. 2A-2C, pores with some directionality with respect to the direction of electromagnetic wave reflect them more efficiently than the pores that are parallel to the direction of electromagnetic wave. There are arrows 203, which represent a weakened electromagnetic wave after some part of the incoming wave has been reflected or absorbed.

Figure 3:
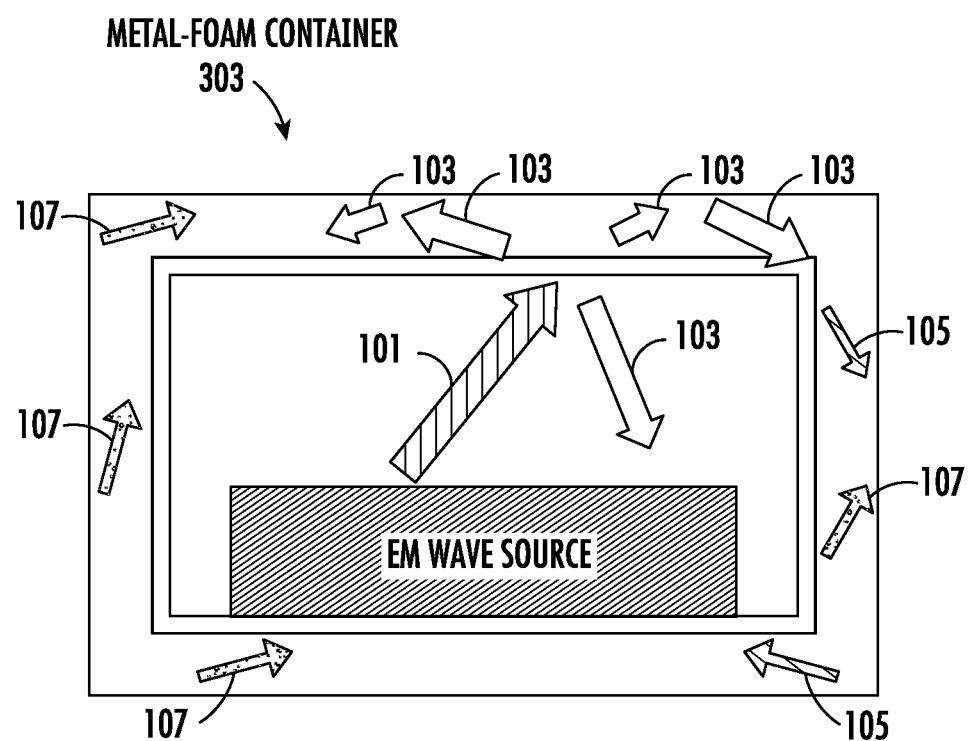
FIG. 3 shows a schematic of a metal-foam container as electromagnetic-wave-shielding part of a component for use in an electronic device that can generate harmful electromagnetic waves to human body.

FIG. 3 shows a schematic of a metal-foam container 303 as electromagnetic-wave-shielding part of a component for use in an electronic device that can generate harmful electromagnetic waves to the human body or sensitive electronic component.

In an implementation, a structure is for a metal-foam container or sheet device. The metal-foam container or sheet device acts as both a heat sink and a shielding block for an electronic device by being in contact with a surface of the electronic device that generates electromagnetic waves.

The structure includes a metal-foam material containing uniform microscale pore structure that effectively shields or reduces electromagnetic waves generated by electronic device due to its enhanced surface area. The pore size of the metal-foam material can range from about 0.1 microns to about 300 hundred microns (e.g., 0.3, 0.5, 0.65, 0.9, 1, 2, 3, 4, 5, 8, 10, 20, 30, 40, 50, 60, 66, 70, 80, 90, 100, 120, 140, 160, 170, 180, 200, 220, 240, 260, or 280 microns). A porosity of the metal-foam material can range from about 50 percent to about 85 percent (e.g., 51, 52, 53, 55, 56, 58, 59, 60, 63, 66, 67, 68, 72, 74, 75, 77, 78, 80, or 82 percent). A thickness of the metal-foam material of the container or sheet can range from about 100 microns to about 1 millimeter (e.g., 150, 200, 300, 400, 500, 600, 700, 800, or 900 microns).

In various implementations, the metal-foam material is copper foam, tin foam, copper-tin alloy foam, nickel foam, copper-nickel alloy foam, iron foam, stainless steel foam, aluminum foam, or titanium foam. A pore shape is elongational and its elongational axis has an angle of about 20 degrees to about 90 degrees relative to the direction of electromagnetic waves (e.g., 22.5, 24, 25, 26, 27, 28, 30, 33, 36, 37, 38, 40, 45, 60, 66, 70, 75, 80, or 86 degrees).

Figure 4:
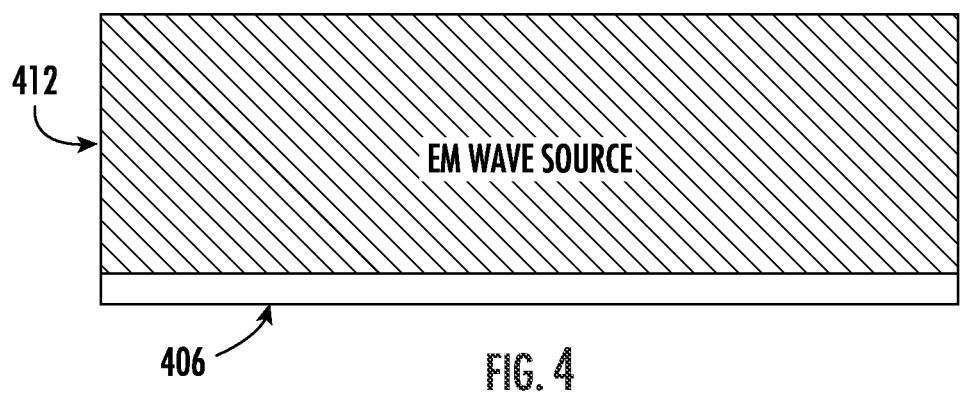
FIG. 4 shows a metal-foam sheet that acts as both a heat sink and an electromagnetic wave shielding block.

FIG. 4 shows an example of metal-foam sheet 406 that acts as both a heat sink and an electromagnetic wave shielding block for an electromagnetic wave source 412. EM wave source 412 is placed in contact with metal-foam sheet 406. There can be a thermal interface material such as thermal paste, thermal adhesive, or other compound between the EM wave source and the metal-foam sheet. The thermal interface material (not shown) would improve the heat transfer from the EM wave source, a heat source in operation, to the metal-foam sheet, which would dissipate the heat into air, liquid (e.g., water) or fluid that is in contact with the metal foam more efficiently due to the enhanced surface area of the metal foam. Additionally, the heat-sink metal-foam sheet can be attached to the EM source device via a common welding, brazing, or soldering method.

The EM wave source may be an integrated circuit that generates heat. The metal-foam sheet and EM wave source can be held together by a bracket, clamp, screw, holder, or other mechanism. In addition to being a heat sink, the metal-foam sheet would be an electromagnetic wave shield due to its enhanced surface area for electromagnetic wave generated by the EM wave source.

A manufacturing process to create the metal-foam material comprises at least one of freeze casting, space holder, or dealloying. In an implementation, the manufacturing process to form copper (or titanium) foam material with directional pores can include a freeze casting method. In brief, freeze casting involves freezing a copper oxide powder (or titanium powder) slurry and then drying under vacuum and low temperature. The result is a copper oxide (or titanium)

green body. The copper oxide (or titanium) foam green body is sintered or reduced to obtain a copper (or titanium) foam. The sintering or reduction would occur in a hydrogen or argon gas (or other noble gas) environment.

Specifically, for a slurry, a copper oxide powder is mixed in water (e.g., deionized water) in a volume fraction of between about 6 volume percent and about 25 volume percent (e.g., 7, 8, 9, 10, 12.5, 15, 18, 19, 20, 22, or 25 percent) following the additions of a binder (e.g., polyvinyl alcohol (PVA)) and a dispersant. A titanium powder is mixed in water in a weight fraction of between about 30 weight percent and about 70 weight percent (e.g., 32, 33, 35, 40, 45, 46, 48, 50, 53, 55, 57, 58, 59, 60, 63, 66, 67, or 68 weight percent) following the additions of a binder and a dispersant.

The water-based copper oxide powder (or titanium powder) slurry is frozen and dried at low temperature of between about −10 degrees Celsius and about −80 degrees Celsius (e.g., −12, −15, −20, −30, −33, −34, −36, −40, −42, −45, −46, −47, −48, −50, −54, −56, −57, −59, −60, −64, −66, −68, −70, −72, or −76 degrees Celsius). As a result of this freeze casting technique, a copper oxide (or titanium powder) green body is formed.

After sublimation, the dried copper oxide (or titanium) foam green body is reduced and then sintered at high temperature. For example, the green body is reduced at temperature between about 250 degrees Celsius and 550 degrees Celsius (e.g., 260, 270, 280, 290, 300, 320, 325, 350, 360, 380, 390, 410, 420, 435, 452, 460, 463, 468, 470, 480, 490, 500, 525, 530, or 540 degrees Celsius) for about 3 hours to about 15 hours (e.g., 3.5, 4, 5, 6, 7, 8, 9, 10, 11, 12, 13, or 14 hours) under an about 0 percent to about 10 percent hydrogen (balance argon) gas environment (e.g., 0.5, 1, 2, 4, 5, 6, 7, 8, or 9 percent). Subsequently, the green body is sintered at temperature between about 700 Celsius and about 1100 degrees Celsius (e.g., 720, 740, 780, 800, 860, 900, 940, 960, 980, 1000, 1020, 1040, or 1080 degrees Celsius) for about 5 hours to about 30 hours (e.g., 6, 7, 8, 9, 10, 11, 12, 13, 14, 18, 20, 22, 24, 25, 26, 28, or 29 hours) under an about 0 percent to about 10 percent hydrogen (balance argon) gas environment (e.g., 0.5, 1, 2, 4, 5, 6, 7, 8, or 9 percent). This creates a three-dimensionally connected solid pore structure, such as a copper foam or titanium foam material for an electromagnetic wave shield or heat shield (if used as such), or combination.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A structure comprising:
   a metal-foam material containing uniform microscale directional pore structure that effectively shields or reduces electromagnetic waves generated by electronic device due to its enhanced surface area and directional pore structure,
   wherein the pore shape is elongational and its elongational axis has an angle of about 20 degrees to about 90 degrees relative to the direction of electromagnetic waves.

2. The structure of claim 1 wherein the pore size of the metal-foam material ranges from about 0.1 microns to about 300 hundred microns.

3. The structure of claim 1 wherein the porosity of the metal-foam material ranges from about 50 percent to about 85 percent.

4. The structure of claim 1 wherein the structure comprises at least one of a container or sheet, and the thickness of the metal-foam material of the container or sheet ranges from about 100 microns to about 1 millimeter.

5. The structure of claim 1 wherein the metal-foam material is at least one of a copper foam, tin foam, copper-tin alloy foam, nickel foam, copper-nickel alloy foam, iron foam, stainless steel foam, aluminum foam, or titanium foam.

6. The structure of claim 1 wherein the structure comprises at least one of a container or sheet, and the container or sheet device acts as both a heat sink and a shielding block for an electronic device by being in contact with a surface of the electronic device that generates electromagnetic waves.

7. The structure of claim 1 wherein a manufacturing process to create the metal-foam material comprises at least one of freeze casting, space holder, or dealloying.

8. The structure of claim 1 wherein a manufacturing process to create the metal-foam material comprises a freeze casting method consisting of a powder slurry freezing or drying and reduction or sintering processes, where a water-based copper oxide powder slurry is frozen and dried at low temperature between about −10 degrees Celsius and about −80 degrees Celsius to form a copper oxide green body.

9. The structure of claim 8 where after a complete sublimation, the dried copper oxide green body is reduced to copper foam, which is then sintered at high temperature.

10. The structure of claim 9 where the dried copper oxide green body is reduced at temperature between about 250 degrees Celsius and 550 degrees Celsius for about 3 hours to about 15 hours under an about 0 percent to about 10 percent hydrogen (balance argon) gas environment, where as a result, a metallic copper foam pore structure is formed.

11. The structure of claim 10 where the reduced copper foam is sintered at temperature between about 700 Celsius and about 1100 degrees Celsius for about 5 hours to about 30 hours under an about 0 percent to about 10 percent hydrogen (balance argon) gas environment.

12. The structure of claim 8 wherein copper oxide powder is mixed in deionized water in a volume fraction of between about 6 volume percent and about 25 volume percent following the additions of a binder and a dispersant.

13. The structure of claim 8 wherein titanium powder is mixed in deionized water in a weight fraction of between about 30 weight percent and about 70 weight percent following the additions of a binder and a dispersant.

14. A metal-foam container comprising the structure of claim 1.

15. A device comprising the structure of claim 1.

16. The structure of claim 1 wherein the metal-foam material comprises a titanium foam, and a manufacturing process to create the titanium-foam material comprises at least one of freeze casting, space holder, or dealloying.

17. The structure of claim 1 wherein the metal-foam material comprises a copper foam, and a manufacturing process to create the copper-foam material comprises at least one of freeze casting, space holder, or dealloying.

18. A structure comprising:
   a metal-foam material containing uniform microscale directional pore structure that effectively shields or reduces electromagnetic waves generated by an electronic device due to its enhanced surface area and directional pore structure, wherein the structure comprises a sheet and a directionality of the pore structure along a first direction of the sheet, and the first direction is transverse to electromagnetic waves generated by electronic device.

19. The structure of claim 18 wherein the metal-foam material is at least one of a copper foam, tin foam, copper-tin alloy foam, nickel foam, copper-nickel alloy foam, iron foam, stainless steel foam, aluminum foam, or titanium foam.

20. The structure of claim 18 wherein the pore shape is elongational and its elongational axis has an angle of about 20 degrees to about 90 degrees relative to the direction of electromagnetic waves.

\* \* \* \* \*